(12) United States Patent
Kao

(10) Patent No.: US 7,822,910 B2
(45) Date of Patent: *Oct. 26, 2010

(54) METHOD OF FLEXIBLE MEMORY SEGMENT ASSIGNMENT USING A SINGLE CHIP SELECT

(75) Inventor: Rom-Shen Kao, Durham, NC (US)

(73) Assignee: Qimonda North America Corp., Cary, NC (US)

( * ) Notice: Subject to any disclaimer, the term of this patent is extended or adjusted under 35 U.S.C. 154(b) by 418 days.

This patent is subject to a terminal disclaimer.

(21) Appl. No.: 11/843,550

(22) Filed: Aug. 22, 2007

(65) Prior Publication Data

US 2009/0052270 A1 Feb. 26, 2009

(51) Int. Cl.
*G06F 12/06* (2006.01)
*G11C 8/10* (2006.01)

(52) U.S. Cl. .................... 711/5; 711/103; 711/202; 365/51; 365/63; 365/230.03; 365/230.06

(58) Field of Classification Search ................ None
See application file for complete search history.

(56) References Cited

U.S. PATENT DOCUMENTS

| | | | | |
|---|---|---|---|---|
| 4,392,212 A | * | 7/1983 | Miyasaka et al. | 365/230.06 |
| 4,982,265 A | * | 1/1991 | Watanabe et al. | 257/737 |
| 5,345,412 A | * | 9/1994 | Shiratsuchi | 365/63 |
| 5,430,859 A | * | 7/1995 | Norman et al. | 711/103 |
| 5,587,341 A | * | 12/1996 | Masayuki et al. | 438/109 |
| 7,236,423 B2 | * | 6/2007 | Sohn et al. | 365/230.08 |
| 2007/0126105 A1 | * | 6/2007 | Yamada et al. | 257/686 |
| 2007/0223290 A1 | * | 9/2007 | Sohn et al. | 365/191 |
| 2009/0052270 A1 | * | 2/2009 | Kao | 365/230.06 |

* cited by examiner

*Primary Examiner*—Jack A Lane
(74) *Attorney, Agent, or Firm*—Patterson & Sheridan, LLP

(57) ABSTRACT

Embodiments of the invention may generally provide techniques that allow mapping of memory devices in a multi-chip package (MCP) to memory segments of an address space. For some embodiments, a multi-bit device ID, which corresponds to a memory segment to which that device is mapped, is loaded for each memory device. Higher order address bits are then compared to the device IDs assigned to each device. An internally generated chip select line is asserted for a device having a match between the address bits and its device ID.

19 Claims, 11 Drawing Sheets

US 7,822,910 B2

METHOD OF FLEXIBLE MEMORY SEGMENT ASSIGNMENT USING A SINGLE CHIP SELECT

BACKGROUND OF THE INVENTION

DESCRIPTION OF THE RELATED ART

Multi-chip packages (MCPs) are individual semiconductor packages, made of plastic or ceramic, containing two or more die connected internally with wire-bonding. MCPs allow multiple devices to be integrated into a single, more compact, package with the same footprint on a printed circuit board (PCB) as a single chip device. MCPs typically contact the PCB with pins, such as solder balls or other type of conductive elements.

SUMMARY OF THE INVENTION

One embodiment provides a multi-chip package. The multi-chip package generally includes at least one chip select pin for receiving a single external chip select signal, a plurality of memory devices, where each memory device is mappable to a memory segment in a memory address space via a separate programmable multi-bit device ID corresponding to the memory segment and responsive to an internal chip select, and one or more chip select logic circuits configured to generate the individual internal chip select for each of the plurality of memory devices based on the external chip select signal and whether or more external bits match the device ID.

One embodiment provides a method of mapping memory devices in a multi-chip package (MCP) to memory segments of an address space. The method generally includes loading a multi-bit device ID, for each memory device, corresponding to a memory segment to which that device is mapped, receiving a single chip select signal from a source external to the MCP, receiving a plurality of address bits, identifying one of the devices to select based on a match between the address bits and a corresponding device ID, and asserting a chip select to select the identified device.

One embodiment provides a method for replacing a faulty memory segment in a multi-chip device having a plurality of memory devices, each having a multi-bit device ID that maps the memory device to a corresponding memory segment. The method generally includes executing a diagnostic test to detect a faulty memory device mapped to a first memory segment, re-programming a device ID associated with the faulty memory device so the faulty memory device is no longer mapped to the first memory segment, and re-programming a device ID associated with a redundant memory device so that the redundant memory device is mapped to the first memory segment.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention may generally provide techniques that allow a single externally supplied chip select signal to be used to independently select a plurality of devices in a multi-chip package (MCP). For example, for some embodiments, higher order address bits are compared to device IDs assigned to each device. An internally generated chip select line is asserted for a device having a match between the address bits and its device ID.

Figure 1:
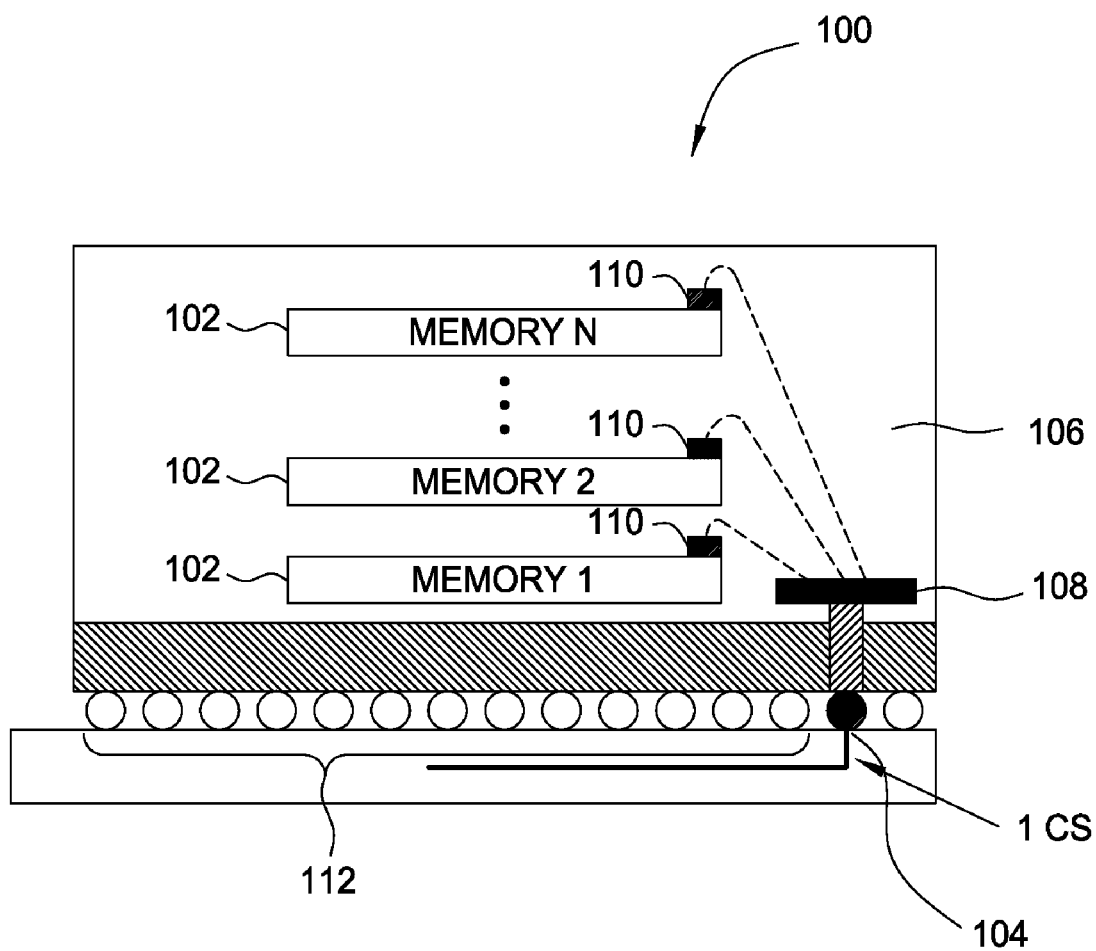
FIG. 1 illustrates an example multi-chip package (MCP) according to one embodiment of the present invention.

FIG. 1 is a block diagram illustrating an embodiment of a multi-chip package (MCP) 100 employing a plurality of memory devices 102, a chip select logic circuit 108, and an external chip select pin 104 within an overall encapsulation material 106. Each memory device 102 can be a DRAM, FLASH, or any other volatile or non-volatile memory. Additionally, the memory devices 102 in the MCP 100 do not have to be of the same type.

Each memory device 102 is accessed via its own individual internally-generated chip select 110. For one embodiment, the internal chip selects 110 may be driven by the chip select logic circuits 108 integrated in each device, which are configured to generate the individual internal chip select 110 for each memory device 102 based on the external chip select pin 104 and other external bits 112, for example address bits. For another embodiment, the chip select logic circuit 108 may be located elsewhere on the MCP 100, for example, in a separate device that generates chip selects that are routed to each device (e.g., via wirebonding).

Figure 2A:
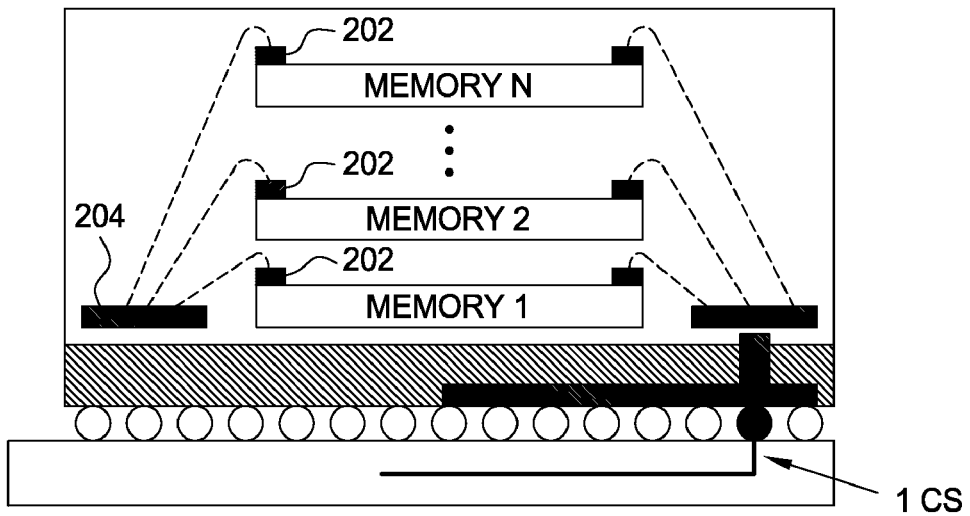
FIGS. 2A and 2B illustrate the designation of device IDs via wirebonding according to one embodiment of the invention.

Regardless, the internal chip select signals are generated based on a match between the additional bits and a device identification (ID) corresponding to each device. The device ID may be set in a variety of different ways. FIG. 2A illustrates one embodiment of the invention, where the device ID's 202 are set to a fixed configuration at a wire bonding level 204. One embodiment of the invention uses pull-up and/or pull-down resistors to hardcode the values of the device ID 202 at the wire bonding level 204.

Figure 2B:
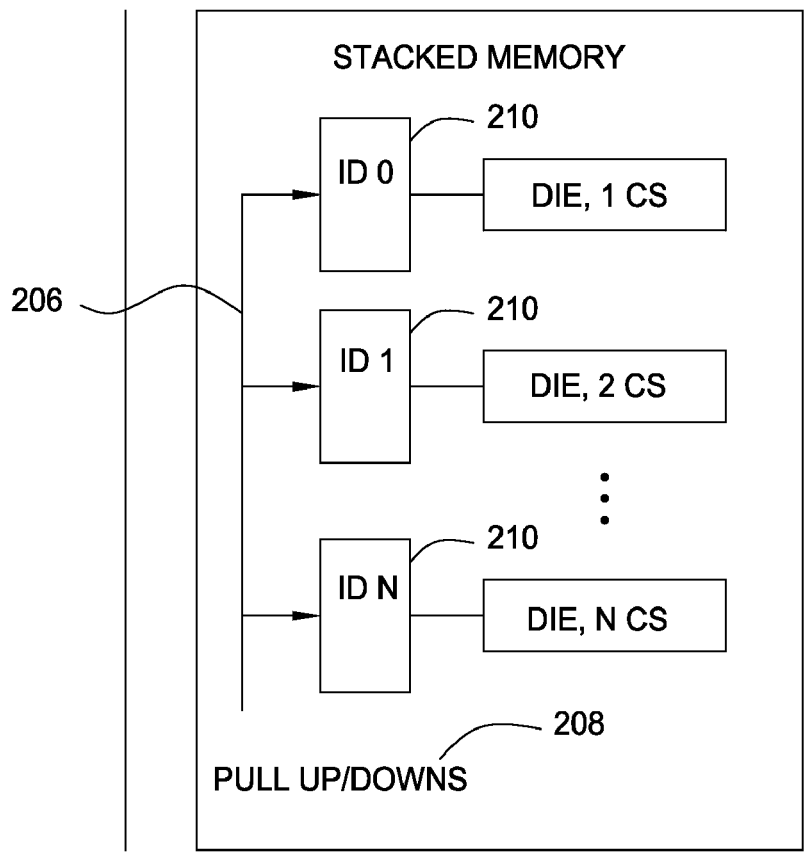

FIG. 2B is a logical representation of an embodiment of the invention, where the wires 206 driven by the pull-up and/or pull-down resistors 208 in order to preset the device ID's 202 are latched into registers 210.

Figure 3A:
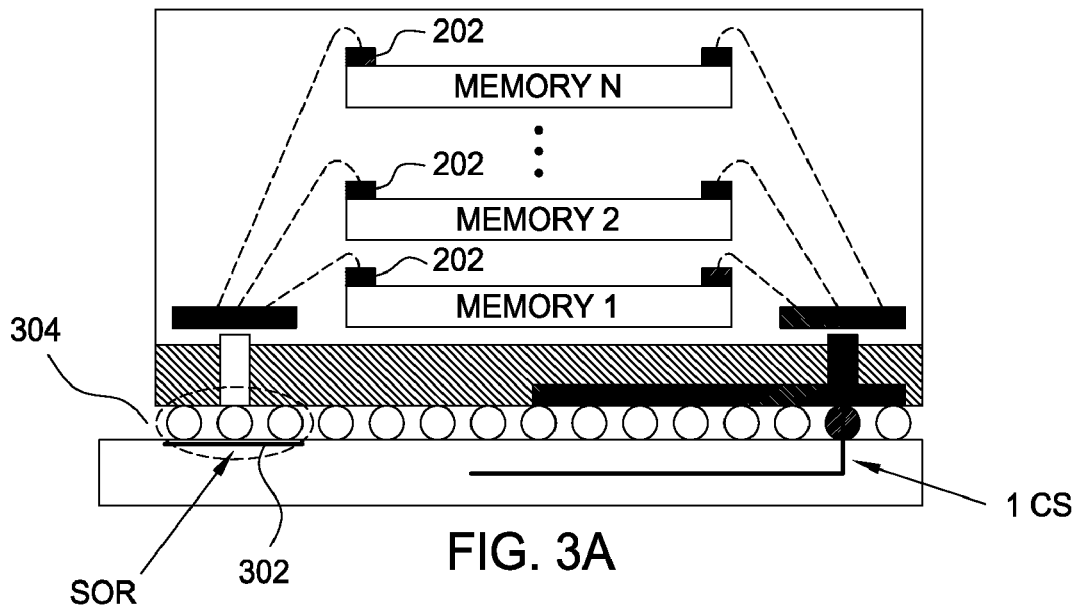
FIGS. 3A and 3B illustrate the designation of device IDs via sense on reset (SOR) according to another embodiment of the invention.
Figure 3B:
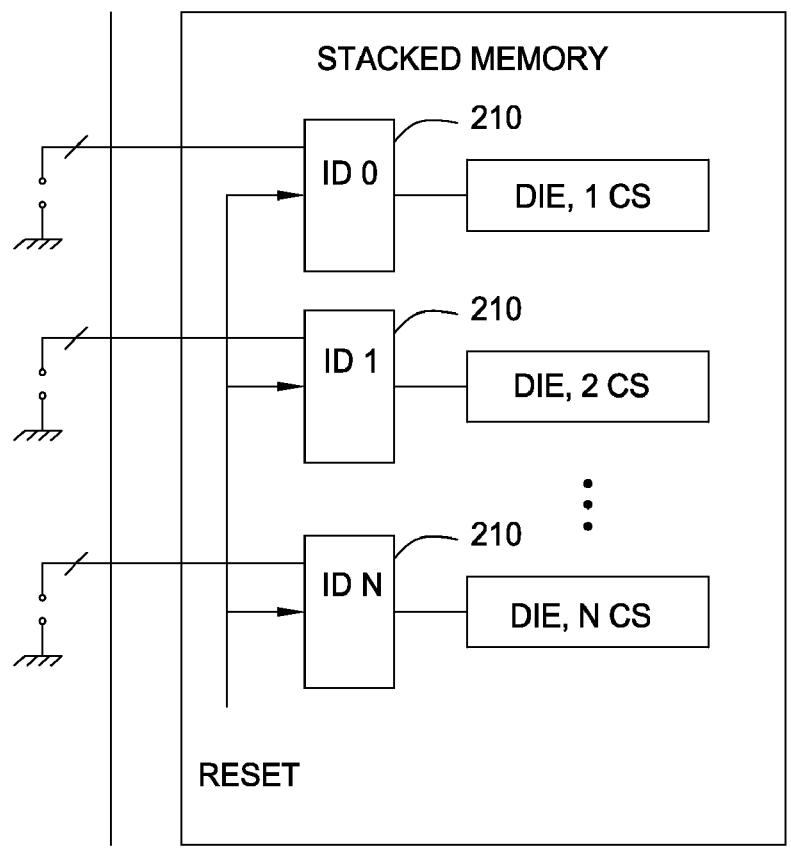

Another embodiment of the invention allows the device ID's 202 to be preset during reset, a process commonly referred to as Sense on Reset. For example, FIG. 3A illustrates the use of a sense-on-reset (SOR) 302. While in reset, a group of pins 304 are driven to certain values to preset the device ID 202. As illustrated in FIG. 3B, the SOR signals may be latched into device ID registers 210 for use during normal operation. After reset is de-asserted, the device ID 202 is set and the pins 304 used to preset the device ID 202 are returned to their normal functionality, for example address and data pins.

Figure 4:
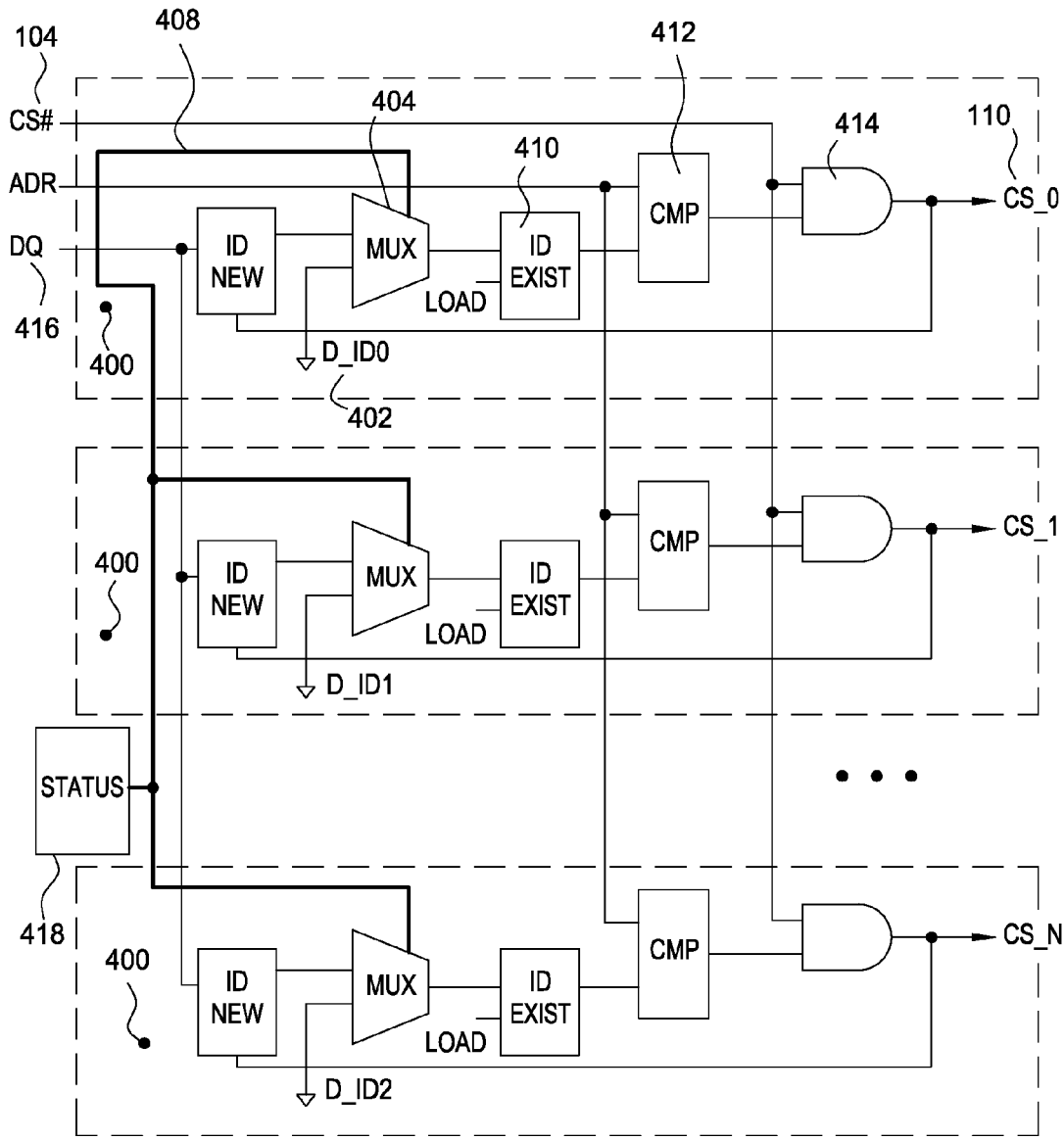
FIG. 4 is a logical representation of a plurality of chip select logic circuits according to one embodiment of the present invention.
Figure 5:
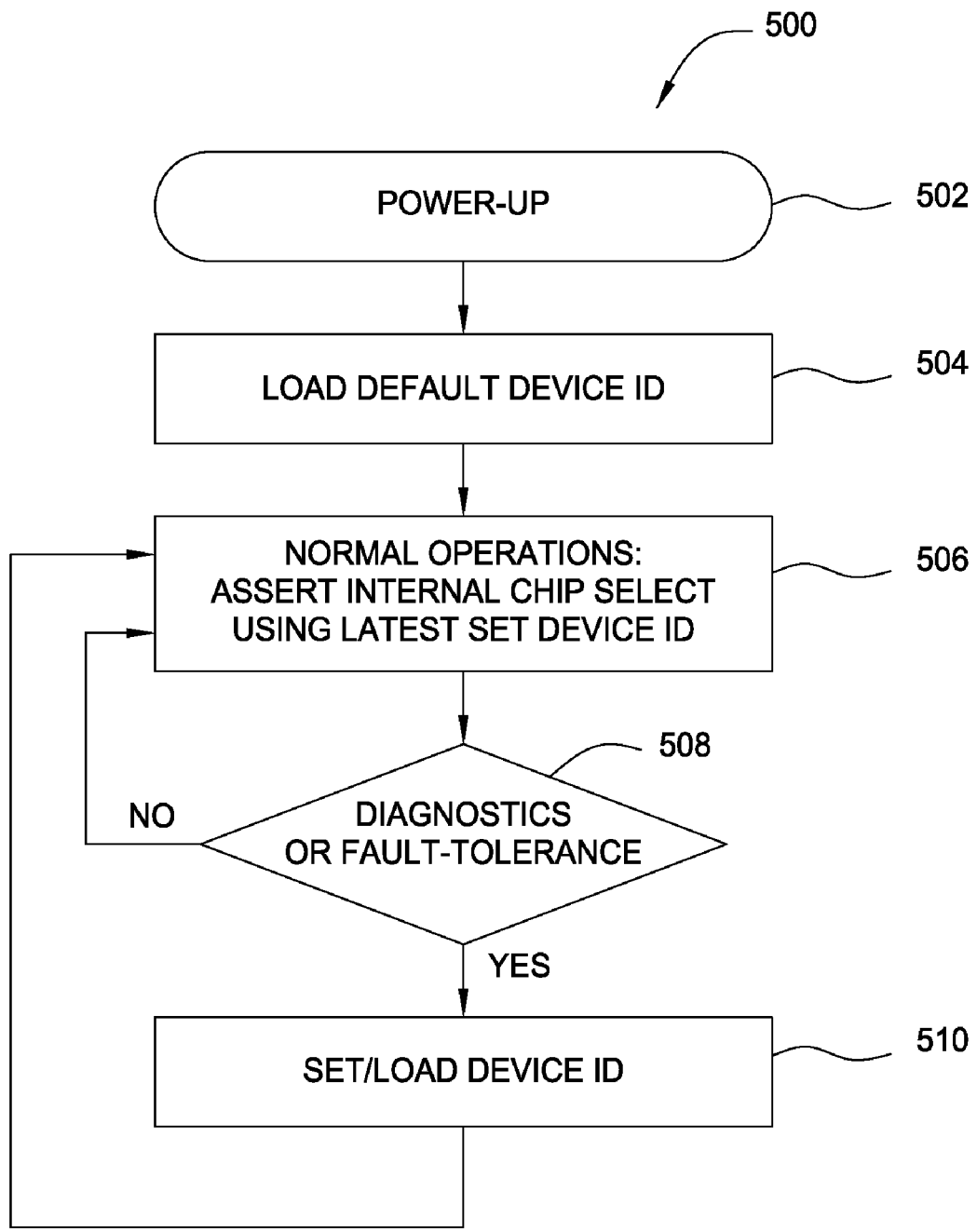
FIG. 5 is a flowchart of example operations for designating device IDs according to FIG. 4 of the present invention.

Another embodiment of the invention allows the device ID's to be programmable via software, for example, allowing default device ID's (set by any of the techniques described above) to be overridden by a host controller. FIG. 4 illustrates a plurality of chip select circuits 400 which allow flexible memory die assignment which incorporate the embodiments mentioned above. The circuits may be best described using the flowchart of FIG. 5, which illustrates example operations 500 for presetting and reprogramming the device ID's.

The operations begin, at step 502, at device power-up. At step 504, a default device ID is preset for each device. The default device IDs may be set by sense-on-reset or by pull-up/pull-down resistors as described above.

FIG. 4 illustrates the use of either embodiment to set default values, and merely illustrates the resulting signals sensed as D_ID0 and D_ID1 402, regardless of whether they are set via wirebonding or SOR. The default ID signals 402 are input to a mux circuit 404, which may be controlled to output the default (SOR or wirebonded) device ID (D_ID) signals during normal operation. For example, the output of the mux may be controlled by a select line 408, which is driven by a status register 418 that indicates if the circuit is in a diagnostic mode. During normal operation, the select line 408 may be driven in a manner such that the mux outputs the D_ID signals, which may be latched in device ID register latches 410. However, as will be discussed in greater detail below, the device ID register latches 410 may be reprogrammed with a new device ID, thus overriding the D_ID signals outputted from the mux during normal operation.

During normal operation (step 506), the latest device ID setting stored in the device ID latches 410 are used. Referring again to FIG. 4, the device ID bits outputted from the device ID latches 410 are compared to higher order address bits. By feeding the output of the comparator 412 to an AND gate 414 that also receives the single externally supplied chip select signal (CS#) 104, the internal chip select 110 for a device will be asserted (or de-asserted) when there is a match between the address bits and the device ID.

When a diagnostic mode is entered, as determined at step 508, a host may be able to set and load a new device ID, overriding the default setting, at step 510.

In the diagnostic mode, the circuit of FIG. 4 allows the reprogramming of the device ID for each of the plurality of memory devices via software. In this mode, the select line 408 may control the mux to output new device ID bits provided on external pins 416 (DQ lines in the illustrated example) rather than the default ID bits. These bits may be loaded into the device ID register latches 410, writing over the default ID bits loaded on reset.

As will be described in greater detail below, reprogramming of device IDs may be done in response to detection of a faulty memory die when the circuit is in diagnostic mode. Regardless of the reason for reprogramming, normal operations may be resumed, at step 506, using the newly latched device IDs.

Figure 6:
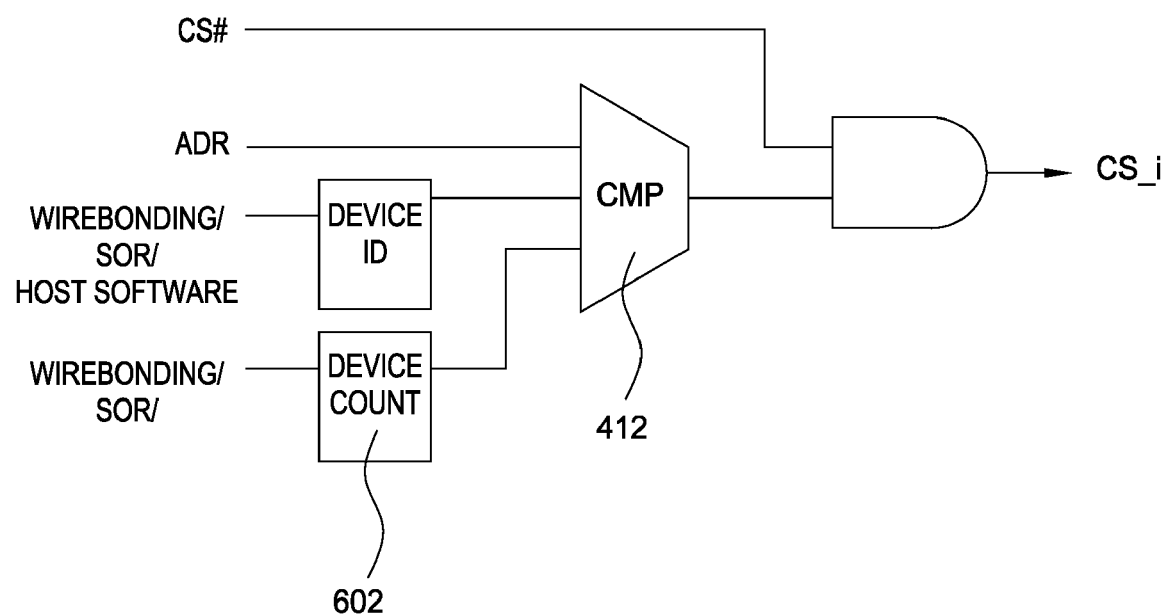
FIG. 6 illustrates an example internal chip select circuit according to one embodiment of the present invention.

The number of higher-order address bits needed to compare against the device ID can vary depending on the number of devices in the system. FIG. 6 illustrates an implementation for determining the number of higher-order address bits needed. Referring to FIG. 6, a comparator 412 can use a device count register latch 602 to determine the needed number of address bits to compare against the device ID. The device count register latch 602 may be set, either by wire bonding or SOR, with the number of devices (device count) in the system. The number of higher-order bits may then be calculated by applying the $\log_2$ N, where N is equal to the device count. As an alternative, the number of address bits may be reduced by using additional external chip select lines, albeit at the expense of consuming external pins.

Figure 7:
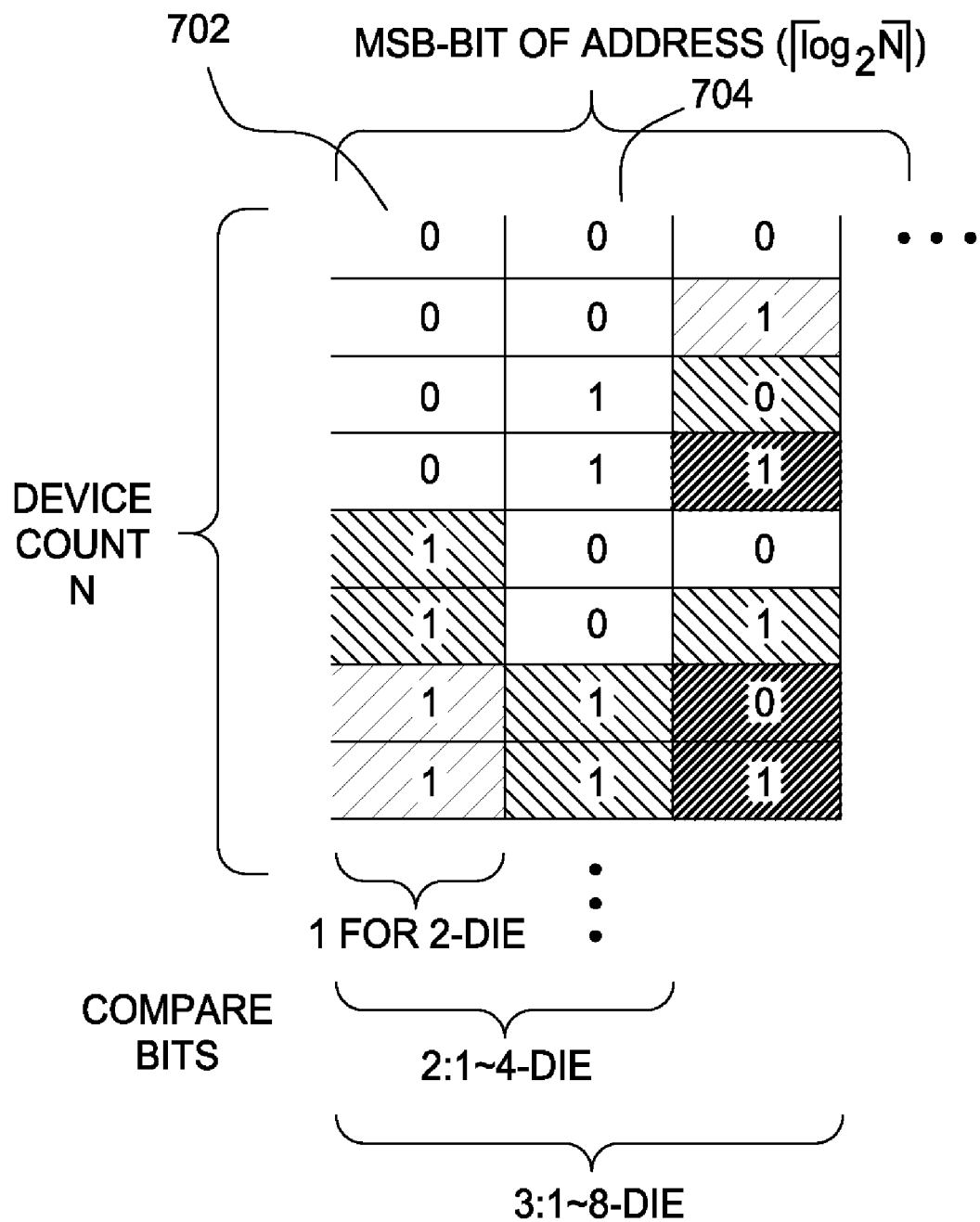
FIG. 7 is a diagram representing a behavior of an internal chip select circuit according to the present invention.

FIG. 7 illustrates the need for more higher-order address bits as the number of devices increases. Column 1 702 represents the most significant bit (MSB) of the address. Column 2 704 represents the second MSB of the address, etc. In a system of one or two devices, only the first MSB of the address is needed to compare against the device ID. In a system of three to four devices, the two MSB's of the address are needed to compare against the device ID, etc.

Figure 8:
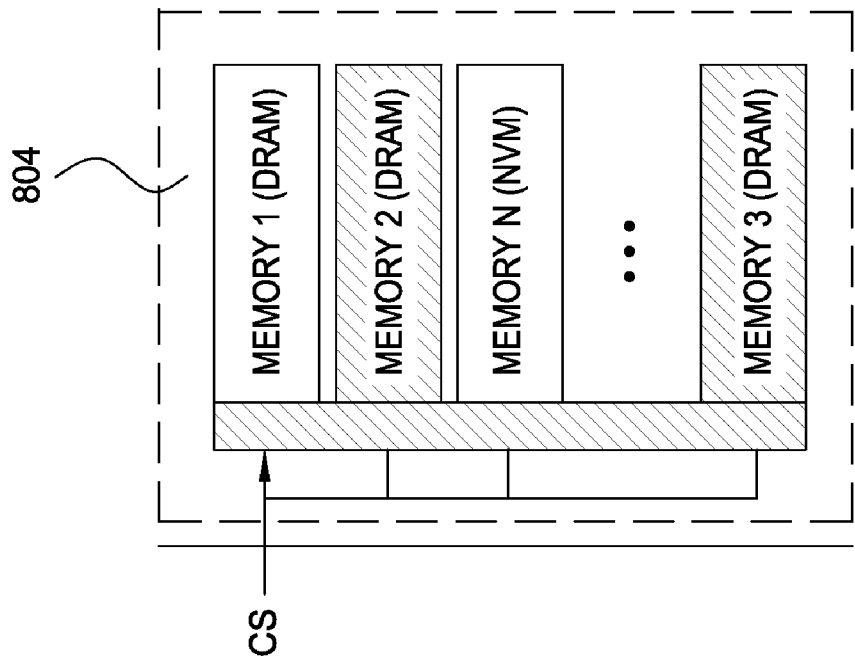
FIG. 8 illustrates the reassignment of memory according to one embodiment of the present invention.
Figure 8:
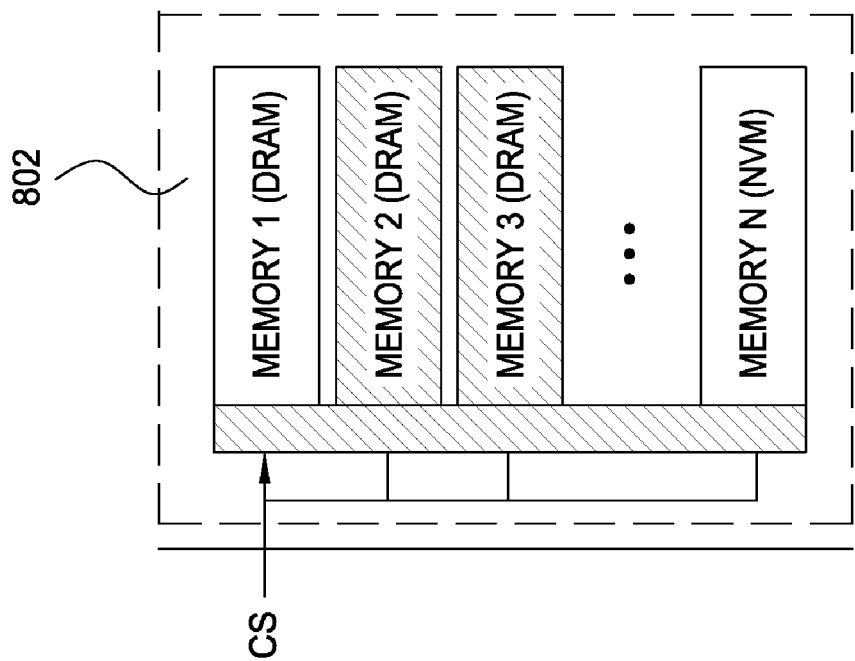

FIG. 8 illustrates another embodiment of the invention, where a single chip select can be used for flexible memory segment assignment. FIG. 8 merely illustrates that before assignment 802, the memory segments can be aligned in consecutive order. After assignment 804, the memory segments can be aligned out of sequence.

Figure 9:
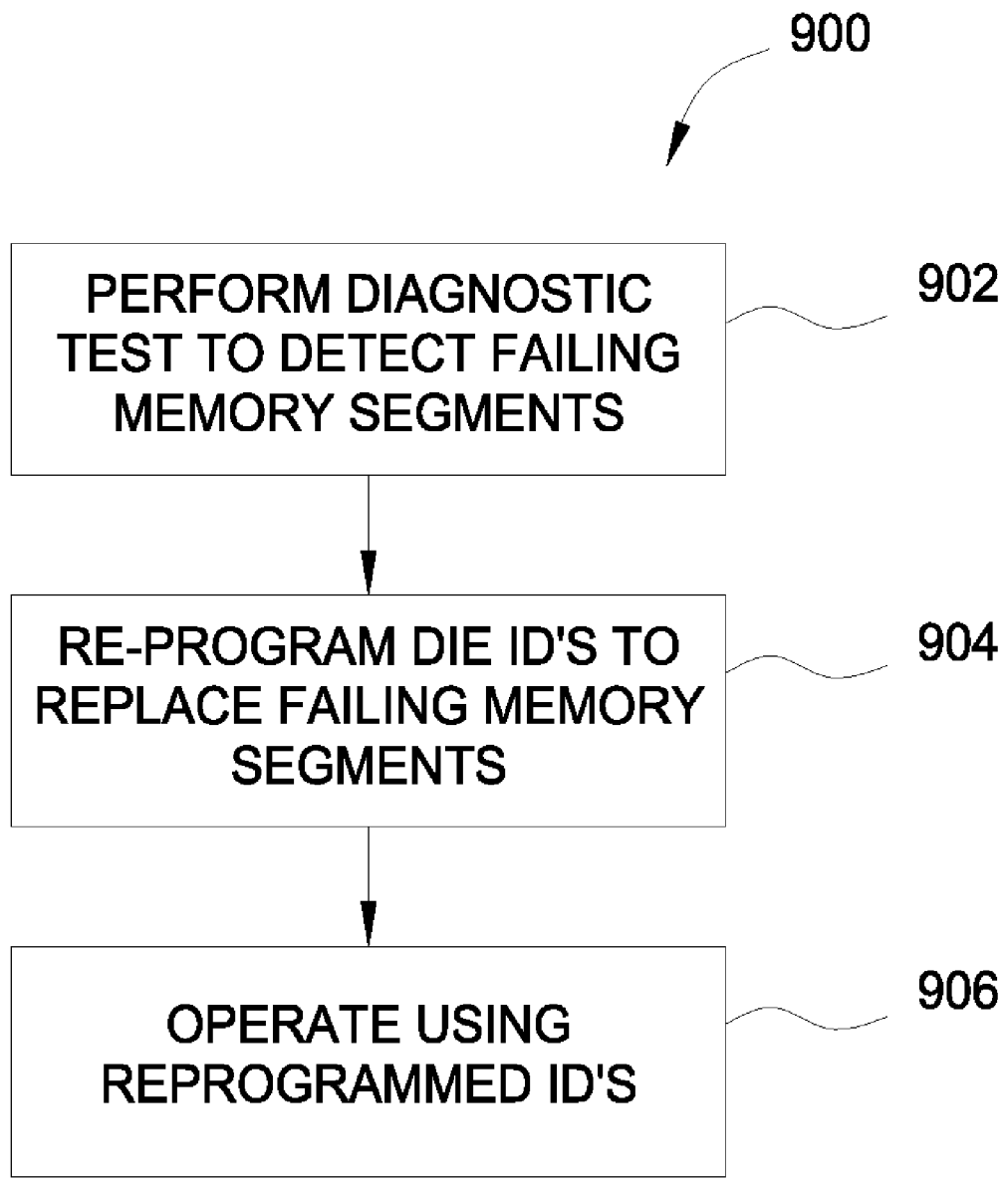
FIG. 9 illustrates example operations for replacing failing memory segments according to one embodiment of the present invention.

As stated earlier, an embodiment of the invention can include a diagnostic mode used to detect faulty memory regions. FIG. 9 illustrates example operations 900 for running the diagnostic mode. At step 902, a diagnostic test is performed to detect failing memory dies. At step 904, the die ID's are re-programmed to replace a failing die with, for example, a redundant memory device, assuming a failing die was found. Finally, at step 906, normal operations may be resumed using the re-programmed ID's.

Figure 10A:
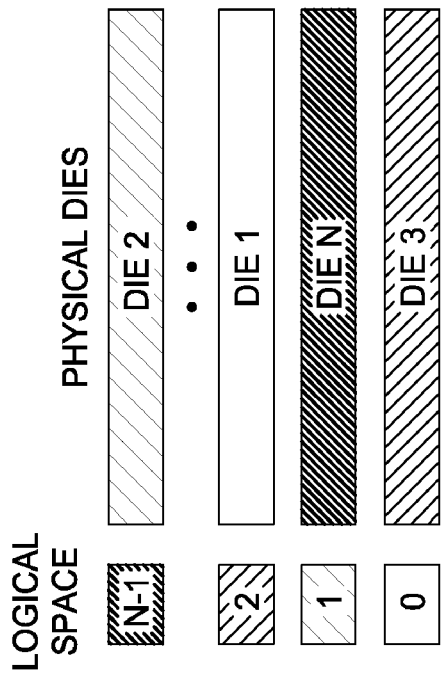
FIGS. 10A-10D illustrate memory space remapping that may be accomplished according to embodiments of the present invention.
Figure 10A:
Figure 10B:
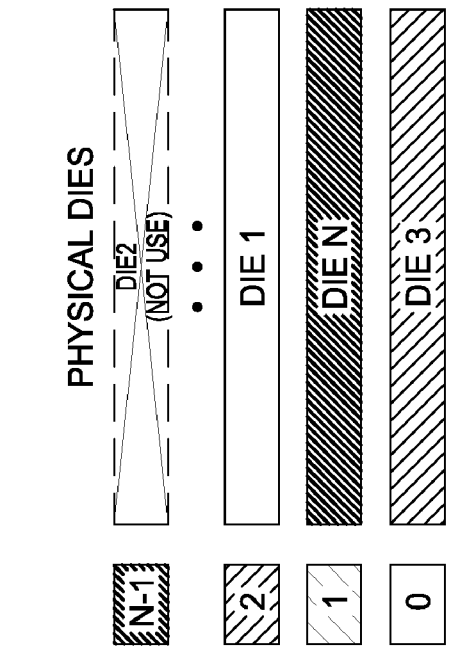

The flexibility of re-programming memory space is illustrated in FIGS. 10A-10D. FIGS. 10A and 10B illustrate how device IDs may be easily mapped to different logical spaces, which may be advantageous, for example, to locate a first type of memory device (e.g., DRAM) to a first logical space, while locating a second type of memory device (e.g., flash memory) to a second logical space.

Figure 10C:
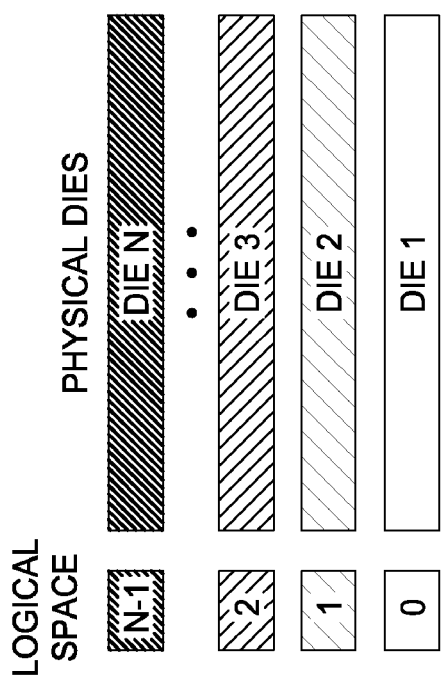
Figure 10C:
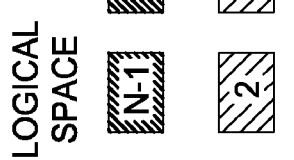
Figure 10D:
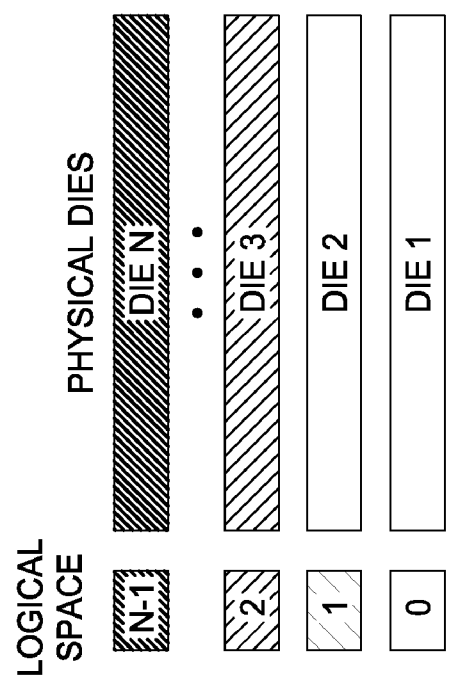
Figure 10D:
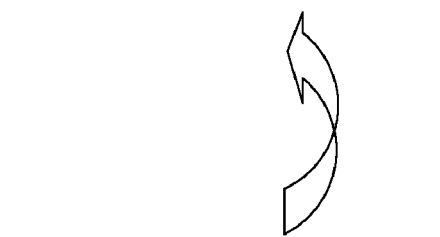

FIGS. 10C and 10D illustrate how a failing memory segment may be replaced. The example assumes that a DIE 2 is mapped to a logical space (2), while a DIE N is initially unused. For example, DIE N may be assigned a device ID corresponding to logical space outside of a usable range, such that it is never selected. However, upon detecting DIE 2 has a defect, the device IDs may be reprogrammed (e.g., via the techniques described above) such that DIE N is assigned the device ID previously assigned to DIE 2 (corresponding to logical space 2), while DIE 2 is assigned the device ID previously assigned to DIE N (outside of the usable logical space).

Figure 11:
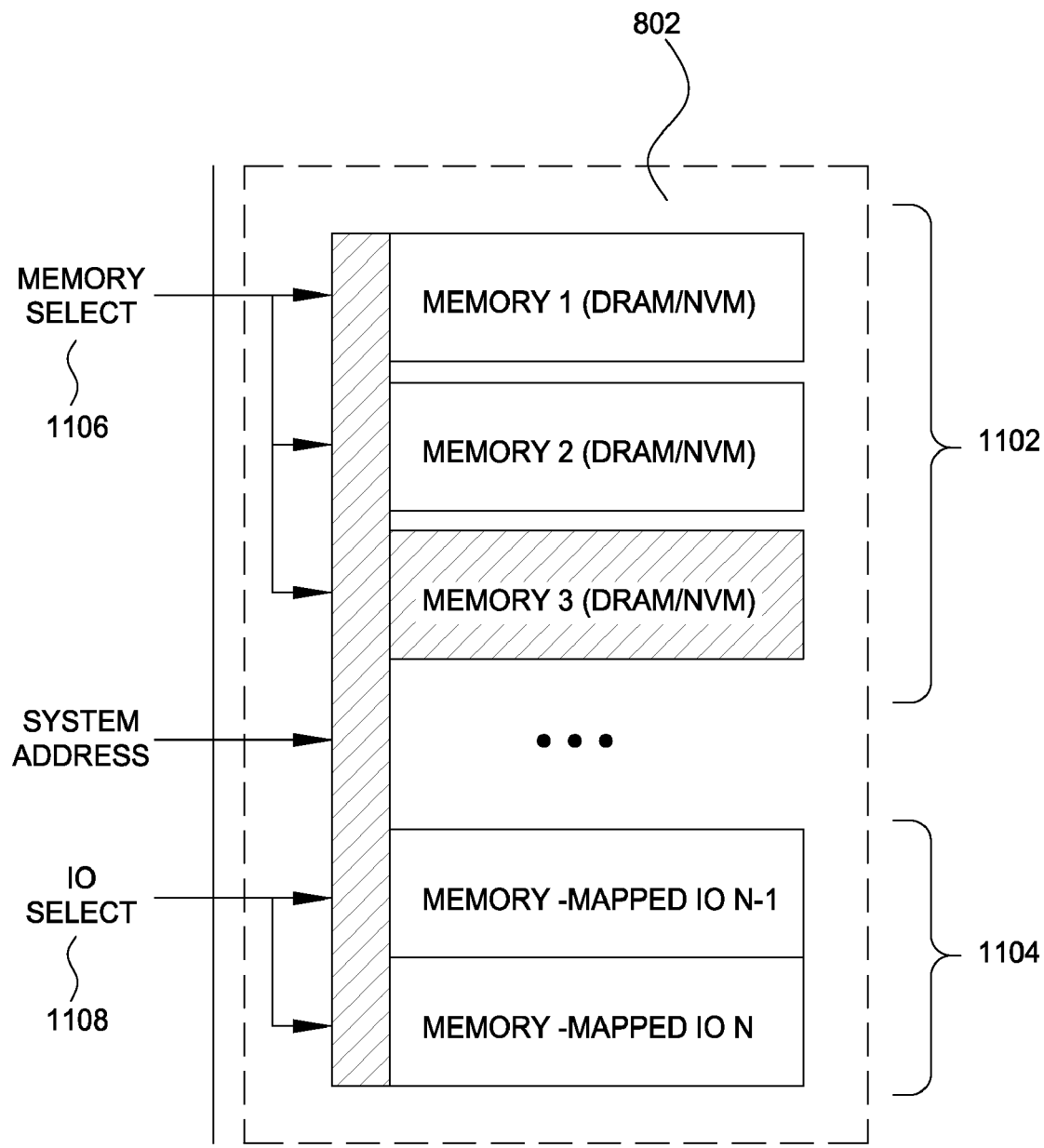
FIG. 11 illustrates assignable memory-mapped I/O selects according to one embodiment of the present invention.

The techniques described herein may also be utilized to allow for flexible memory segment assignment for memory-mapped I/O as well. FIG. 11 illustrates a system having a plurality of memory segments 1102 along with a plurality of memory-mapped I/O segments 1104. As illustrated, a single memory chip select 1106 can be used for the memory segments 1102, and a single I/O chip select 1108 can be used for the memory-mapped I/O segments 1104. Alternatively, a single chip select can be used for both the memory segments 1102 and the memory-mapped I/O segments 1104.

While the foregoing is directed to embodiments of the present invention, other and further embodiments of the invention may be devised without departing from the basic scope thereof, and the scope thereof is determined by the claims that follow.

What is claimed is:

1. A multi-chip package comprising:
   at least one chip select pin for receiving a single external chip select signal;
   a plurality of stacked memory devices, each mappable to a memory segment in a memory address space via a separate programmable multi-bit device ID corresponding to the memory segment and responsive to an internal chip select;
   one or more chip select logic circuits configured to generate the individual internal chip select for each of the plurality of stacked memory devices based on the external chip select signal and whether one or more external bits match the device ID,
   wherein the multi-bit device IDs are programmable via external pins of the multi-chip package.

2. The multi-chip package of claim 1, further comprising:
   circuitry for setting default device IDs;
   circuitry for loading the default device IDs on a power-up; and
   circuitry for allowing the default device IDs to be overwritten with device IDs provided by an external device.

3. The multi-chip package of claim 2, wherein the circuitry for setting default device IDs comprises circuitry to read values set via wire bonding.

4. The multi-chip package of claim 2, wherein the circuitry for setting default device IDs comprises circuitry to read bits via a sense-on-reset process.

5. The multi-chip package of claim 1, wherein the plurality of stacked memory devices comprise of a dynamic random access memory device.

6. The multi-chip package of claim 1, where the plurality of stacked memory devices comprise of a combination of a dynamic random access memory and a non-volatile memory.

7. The multi-chip package of claim 1, wherein a logic circuit for generating an internal chip select is located on each memory device.

8. The multi-chip package of claim 1, wherein a logic circuit for generating the internal chip selects is located in the multi-chip package external to the stacked memory devices.

9. The multi-chip package of claim 1, wherein the stacked memory devices comprise at least one dynamic random access memory (DRAM) device and at least one non-volatile memory device which both share a common interface.

10. A method of mapping stacked memory devices in a multi-chip package (MCP) to memory segments of an address space, comprising:
    for each of the stacked memory devices, loading a multi-bit device ID corresponding to a memory segment to which that device is mapped, wherein the multi-bit device ID is programmable via external pins of the multi-chip package;
    receiving a single chip select signal from a source external to the MCP;
    receiving a plurality of address bits;
    identifying one of the devices to select based on a match between the address bits and a corresponding device ID; and
    asserting a chip select to select the identified device.

11. The method of claim 10, wherein:
    loading a multi-bit device ID comprises loading a default multi-bit device ID; and
    the method further comprises, receiving, from an external device, a device ID to overwrite the default device ID.

12. The method of claim 10, wherein loading a default device ID comprises reading a default device ID set via wire bonding.

13. The method of claim 10, wherein loading a default device ID comprises reading a default device ID set via a sense on reset process.

14. The method of claim 10, wherein the identifying and asserting is performed in logic circuits internal to the devices.

15. The method of claim 10, wherein the identifying and asserting is performed in a logic circuit within the multi-chip package, but external to the stacked memory devices.

16. A method for replacing a faulty memory segment in a multi-chip device having a plurality of stacked memory devices, each having a multi-bit device ID that maps the memory device to a corresponding memory segment, comprising:
    executing a diagnostic test to detect a faulty memory device mapped to a first memory segment;
    re-programming a device ID associated with the faulty memory device so the faulty memory device is no longer mapped to the first memory segment, wherein the device ID is re-programmable via external pins of the multi-chip package; and
    re-programming a device ID associated with a redundant memory device so that the redundant memory device is mapped to the first memory segment.

17. The method of claim 16, wherein the diagnostic test is executed by a controller.

18. The method of claim 17, where the re-programming of the device IDs is executed by the controller.

19. The method of claim 16, wherein each memory device has a default device ID latched on a power-on reset.

* * * * *